United States Patent
Kim et al.

(10) Patent No.: US 11,640,875 B2
(45) Date of Patent: May 2, 2023

(54) MULTILAYER CERAMIC CAPACITOR AND BOARD HAVING THE SAME MOUNTED THEREON

(71) Applicant: SAMSUNG ELECTRO-MECHANICS CO., LTD., Suwon-si (KR)

(72) Inventors: Hyung Joon Kim, Suwon-si (KR); Hyun Ju Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/230,445

(22) Filed: Apr. 14, 2021

(65) Prior Publication Data

US 2022/0165499 A1 May 26, 2022

(30) Foreign Application Priority Data

Nov. 25, 2020 (KR) .................. 10-2020-0159976

(51) Int. Cl.
  *H01G 4/30* (2006.01)
  *H01G 4/012* (2006.01)
  *H01G 4/12* (2006.01)
  *H01G 4/228* (2006.01)

(52) U.S. Cl.
  CPC .............. *H01G 4/30* (2013.01); *H01G 4/012* (2013.01); *H01G 4/12* (2013.01); *H01G 4/228* (2013.01)

(58) Field of Classification Search
  CPC ............ H01G 4/30; H01G 4/12; H01G 4/228; H01G 4/005; H01G 4/012

USPC ............. 361/301.4, 321.1, 321.3, 306.3, 303
See application file for complete search history.

(56) References Cited

U.S. PATENT DOCUMENTS

| | | | | |
|---|---|---|---|---|
| 6,829,134 B2* | 12/2004 | Yamauchi | ............... | H01G 4/30 361/306.3 |
| 2007/0128794 A1* | 6/2007 | Kusano | ............... | H01G 4/2325 257/314 |
| 2008/0130198 A1* | 6/2008 | Nakano | .................. | H01G 4/30 361/303 |

(Continued)

FOREIGN PATENT DOCUMENTS

| | | |
|---|---|---|
| JP | 5131263 B2 | 11/2012 |
| KR | 10-2013-0042924 A | 4/2013 |
| KR | 10-2014-0013996 A | 2/2014 |

*Primary Examiner* — Arun Ramaswamy
(74) *Attorney, Agent, or Firm* — Morgan, Lewis & Bockius LLP

(57) ABSTRACT

A multilayer capacitor includes a capacitor body including first and second dielectric layers and internal electrodes, and including first to sixth surfaces; first and second external electrodes disposed on the fifth and sixth surfaces; and third and fourth external electrodes disposed on the third and fourth surfaces. The internal electrodes include: a first internal electrode disposed on the first dielectric layer and connected to the first and second external electrodes; a second internal electrode disposed on the first dielectric layer and connected to the third external electrode; a third internal electrode disposed on the first dielectric layer and connected to the fourth external electrode; and a fourth internal electrode disposed on the second dielectric layer and overlapping at least a portion of the first to third internal electrodes.

17 Claims, 7 Drawing Sheets

(56) References Cited

U.S. PATENT DOCUMENTS

| | | | |
|---|---|---|---|
| 2009/0154055 A1* | 6/2009 | Takashima | H01G 4/30 361/301.4 |
| 2010/0039750 A1* | 2/2010 | Togashi | H01G 4/228 361/306.3 |
| 2013/0033154 A1* | 2/2013 | Sakuratani | H01C 7/18 310/366 |
| 2013/0100576 A1 | 4/2013 | Seo et al. | |
| 2014/0029159 A1 | 1/2014 | Shimada et al. | |
| 2015/0325371 A1* | 11/2015 | Hattori | H01G 4/30 361/301.4 |
| 2017/0164466 A1* | 6/2017 | Park | H01G 4/012 |
| 2017/0221634 A1* | 8/2017 | Inomata | H01G 4/385 |
| 2018/0226191 A1* | 8/2018 | Yoshida | H01G 4/232 |
| 2020/0111612 A1* | 4/2020 | Jeong | H01G 4/232 |
| 2020/0265999 A1* | 8/2020 | Kuruma | H01G 4/012 |
| 2021/0027949 A1* | 1/2021 | Kobayashi | H01G 4/012 |

\* cited by examiner

MULTILAYER CERAMIC CAPACITOR AND BOARD HAVING THE SAME MOUNTED THEREON

CROSS-REFERENCE TO RELATED APPLICATION(S)

This application claims benefit of priority to Korean Patent Application No. 10-2020-0159976 filed on Nov. 25, 2020 in the Korean Intellectual Property Office, the disclosure of which is incorporated herein by reference in its entirety.

TECHNICAL FIELD

The present disclosure relates to a multilayer ceramic capacitor and a board having the same mounted thereon.

BACKGROUND

A multilayer ceramic capacitor is an electronic component applied to electronic devices within various fields.

Multilayer ceramic capacitors may be classified as a high voltage type multilayer ceramic capacitor, a low ESL type multilayer ceramic capacitor, an embedded type multilayer ceramic capacitor, or an improved bending strength type multilayer ceramic capacitor according to electrical properties thereof.

Recently, a multilayer capacitor having low equivalent series inductance (ESL) has been necessary to reduce ripples in a power current.

SUMMARY

An aspect of the present disclosure is to provide a multilayer capacitor having a high withstand voltage and implementing low ESL properties, and a board including the same mounted thereon.

According to an aspect of the present disclosure, a multilayer capacitor includes a capacitor body including first and second dielectric layers and a plurality of internal electrodes alternately laminated, and including first and second surfaces opposing each other, third and fourth surfaces opposing each other and connected to the first and second surfaces, and fifth and sixth surfaces opposing each other and connected to the first and second surfaces and the third and fourth surfaces; first and second external electrodes disposed on the fifth and sixth surfaces of the capacitor body, respectively; and third and fourth external electrodes disposed on the third and fourth surfaces of the capacitor body, respectively. The internal electrodes include: a first internal electrode disposed on the first dielectric layer and connected to the first and second external electrodes; a second internal electrode disposed on the first dielectric layer, spaced apart from the first internal electrode, and connected to the third external electrode; a third internal electrode disposed on the first dielectric layer, spaced apart from the first internal electrode, and connected to the fourth external electrode; and a fourth internal electrode disposed on the second dielectric layer, spaced apart from the first to fourth external electrodes, and overlapping at least a portion of the first to third internal electrodes.

The first internal electrode may include a first body portion overlapping a portion of the fourth internal electrode; and first and second lead portions extending from the first body portion toward the fifth and sixth surfaces of the capacitor body, respectively.

The second internal electrode may have at least one first cutout portion at a front end, adjacent to the third surface of the capacitor body in a direction perpendicular to the third surface of the capacitor body, and the third internal electrode may have at least one second cutout portion at a front end, adjacent to the fourth surface of the capacitor body in a direction perpendicular to the fourth surface of the capacitor body.

The second internal electrode may have a first cutout portion on at least one corner, and the third internal electrode may have a second cutout portion on at least one corner.

The second internal electrode may include a second body portion overlapping a portion of the fourth internal electrode, and a third lead portion extending from the second body portion toward the third surface of the capacitor body, and the third internal electrode may include a third body portion overlapping a portion of the fourth internal electrode, and a fourth lead portion extending from the third body portion toward the fourth surface of the capacitor body.

The fourth internal electrode may include first and second grooves formed in both front ends in a direction perpendicular to the fifth and sixth surfaces of the capacitor body, respectively.

The fourth internal electrode may include a 4-1 internal electrode and a 4-2 internal electrode disposed on the second dielectric layer and spaced apart from each other in a direction perpendicular to the third and fourth surfaces of the capacitor body.

The 4-1 internal electrode may overlap a portion of the first and second internal electrodes, and the 4-2 internal electrode may overlap a portion of the first and third internal electrodes.

The first and second external electrodes may extend from the fifth and sixth surfaces of the capacitor body to portions of the first and second surfaces, respectively, and the third and fourth external electrodes may extend from the third and fourth surfaces of the capacitor body to portions of the first and second surfaces, respectively.

The first to fourth external electrodes may further include a plating layer disposed on respective surfaces thereof.

According to an aspect of the present disclosure, a board including a multilayer capacitor mounted thereon includes a board having a plurality of electrode pads on an upper surface thereof; and a multilayer capacitor mounted on the board such that corresponding external electrodes are connected to electrode pads, respectively.

According to an aspect of the present disclosure, a multilayer capacitor includes a capacitor body including a dielectric layer and first and second internal electrode layers respectively disposed on opposing surfaces of the dielectric layer; and first to third external electrodes disposed on the capacitor body and spaced apart from each other. The first internal electrode layer includes first to third internal electrodes respectively connected to the first to third external electrodes. The second internal electrode layer is spaced apart from an outer surface of the capacitor body, and overlaps with each of the first to third internal electrodes in a stacking direction of the first and second internal electrode layers.

The first internal electrode may include: a first body portion overlapping a portion of the second electrode layer; and a first lead portion extending from the first body portion and connecting the first body portion to the first external electrode.

The second internal electrode may include: a second body portion overlapping a portion of the second electrode layer; and a second lead portion extending from the second body portion and connecting the second body portion to the second external electrode. The third internal electrode may include: a third body portion overlapping a portion of the second electrode layer; and a third lead portion extending from the third body portion and connecting the third body portion to the third external electrode.

The second internal electrode layer may include a groove overlapping a lead portion of the first internal electrode in the stacking direction of the first and second internal electrode layers.

The second internal electrode layer may include a first portion and a second portion spaced apart from each other, the first portion of the second internal electrode layer may overlap with each of the first and second internal electrodes in the stacking direction of the first and second internal electrode layers, and the second portion of the second internal electrode layer may overlap with each of the first and third internal electrodes in the stacking direction of the first and second internal electrode layers.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
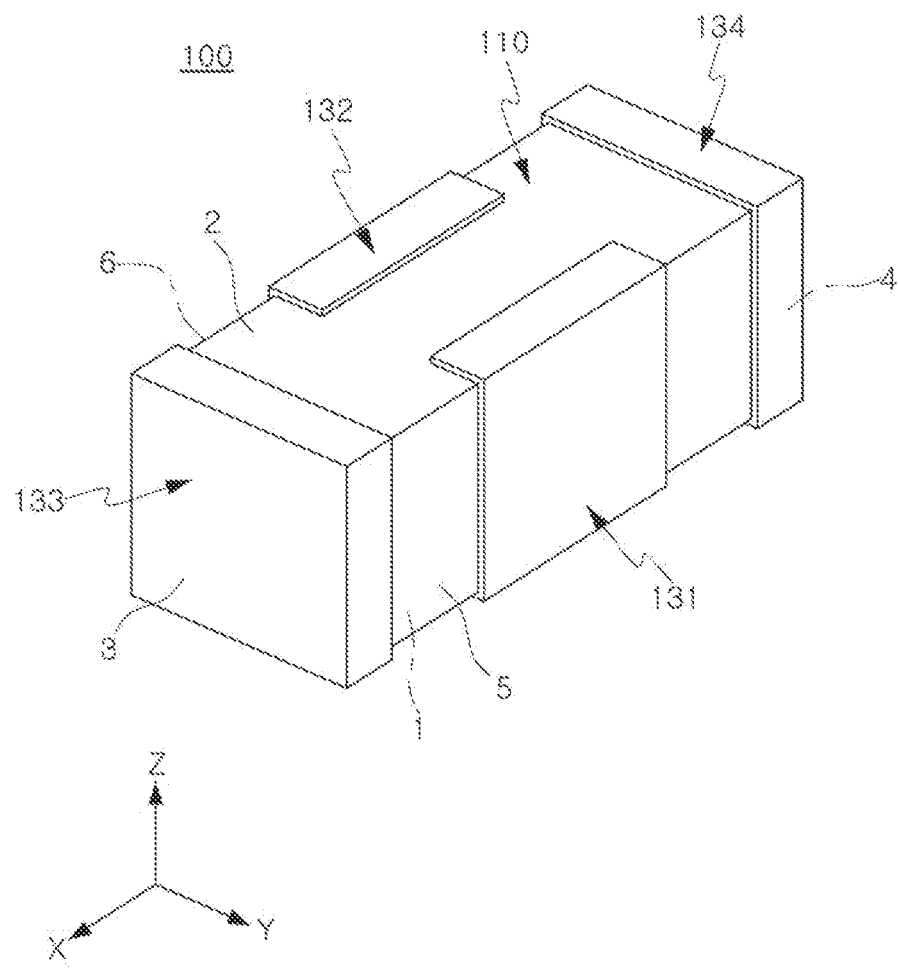
FIG. 1 is a perspective diagram illustrating a multilayer capacitor according to an example embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein.

Rather, these embodiments are provided so that this disclosure will be thorough and complete, and will fully convey the scope of the disclosure to those skilled in the art.

Accordingly, shapes and sizes of elements in the drawings may be exaggerated for clarity of description, and elements indicated by the same reference numeral are same elements in the drawings.

Further, throughout the specification, it will be understood that when a portion "includes" an element, it may further include another element, not excluding another element, unless otherwise indicated.

As for the directions of the hexahedron, in the drawings, X, Y, and Z indicated on the drawings represent a length direction, a width direction, and a thickness direction of the capacitor body, respectively. The thickness direction may be the same as a laminating direction in which first and second dielectric layers are laminated.

Figure 2A:
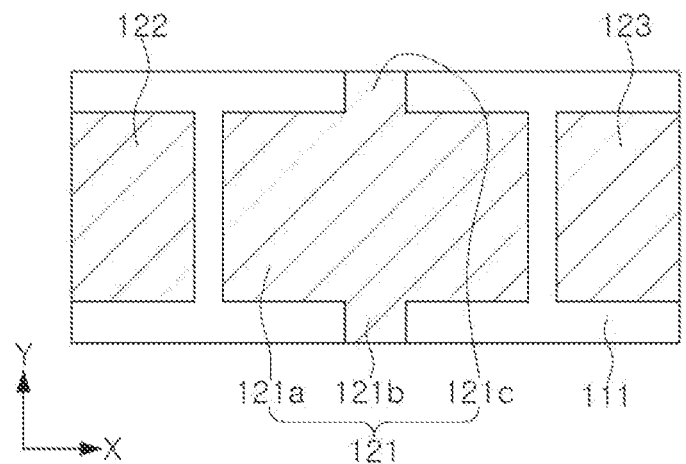
FIGS. 2A and 2B are plan diagrams illustrating a structure of an internal electrode applied to the multilayer capacitor illustrated in FIG. 1.
Figure 2B:
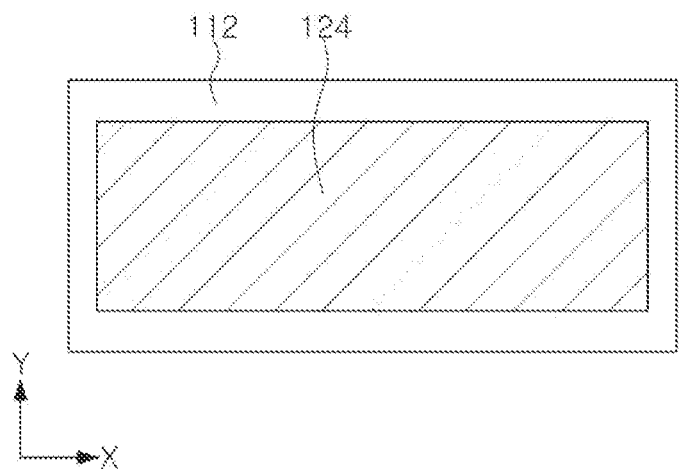
Figure 3:
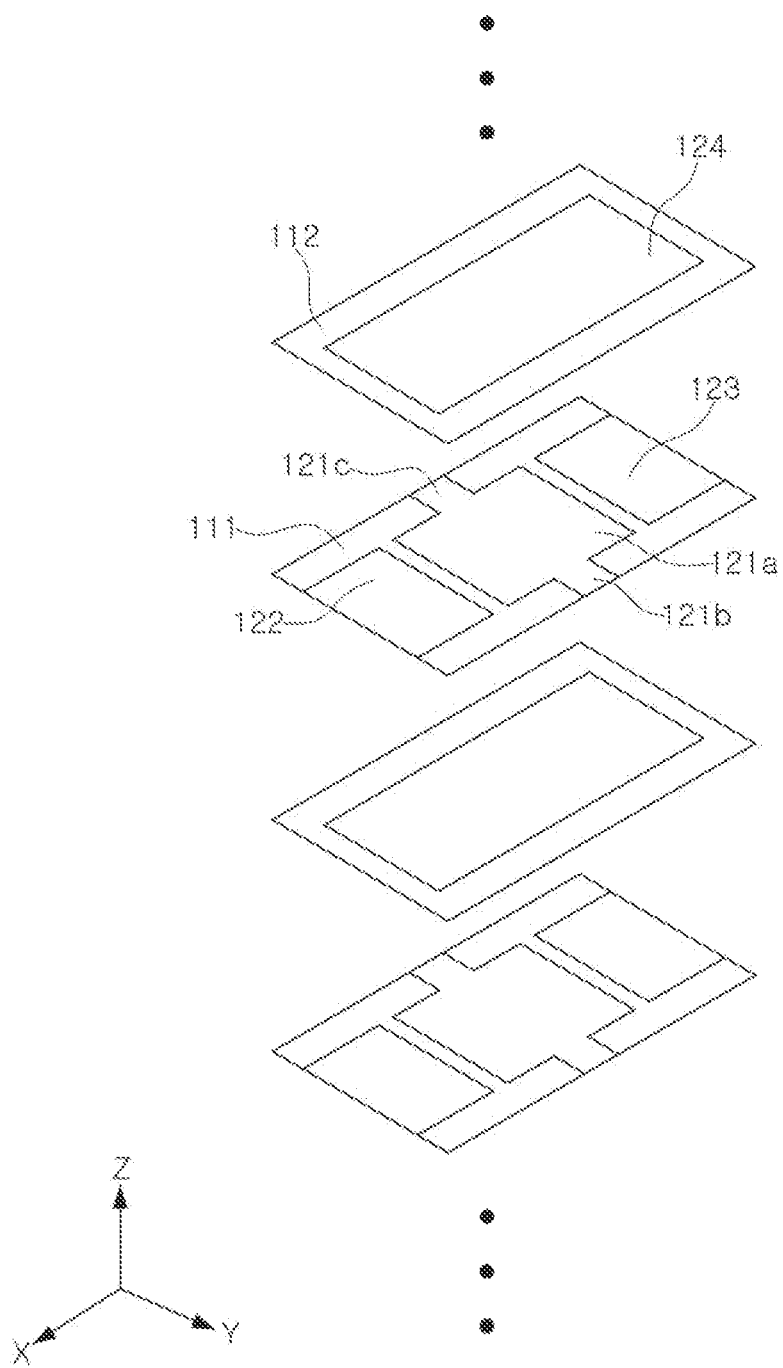
FIG. 3 is an exploded perspective diagram illustrating a laminate structure of first and second dielectric layers illustrated in FIG. 1.

FIG. 1 is a perspective diagram illustrating a multilayer capacitor according to an example embodiment. FIGS. 2A and 2B are plan diagrams illustrating a structure of an internal electrode applied to the multilayer capacitor illustrated in FIG. 1. FIG. 3 is an exploded perspective diagram illustrating a laminate structure of first and second dielectric layers illustrated in FIG. 1.

Referring to FIGS. 1 to 3, a multilayer capacitor 100 in the example embodiment may include a capacitor body 110, a plurality of internal electrodes, and first to fourth external electrodes 131-134.

The capacitor body 110 may include a plurality of first and second dielectric layers 111 and 112 alternately laminated, and may have a substantially hexahedral shape as illustrated in FIG. 1, but an example embodiment thereof is not limited thereto.

The capacitor body 110 may include first and second surfaces 1 and 2 opposing each other in the Z direction, third and fourth surfaces 3 and 4 and opposing each other in the X direction and connected to the first and second surfaces 1 and 2, and fifth and sixth surfaces 5 and 6 opposing each other in the Y direction and connected to the first and second surfaces 1 and 2 and the third and fourth surfaces 3 and 4.

The shape and the dimensions of the capacitor body 110 and the number of the laminated first and second dielectric layers 111 and 112 are not limited to the example illustrated in the drawings.

The first and second dielectric layers 111 and 112 may be in a sintered state, and a boundary between the first and second dielectric layers 111 and 112 adjacent to each other may be integrated such that it may be difficult to identify boundaries therebetween without using a scanning electron microscope (SEM).

The first and second dielectric layers 111 and 112 may include a high-k ceramic material, barium titanate ($BaTiO_3$) or strontium titanate ($SrTiO_3$) ceramic powder, for example, but an example embodiment thereof is not limited thereto as long as sufficient capacitance is able to be obtained.

The first and second dielectric layers 111 and 112 may further include ceramic additives, organic solvents, plasticizers, binders, and dispersants in addition to ceramic powder.

As the ceramic additives, a transition metal oxide or a transition metal carbide, a rare earth element, magnesium (Mg) or aluminum (Al) may be used.

In the capacitor body 110, a plurality of internal electrodes may be disposed and may be separated from each other with the first or second dielectric layers 111 and 112 interposed therebetween.

In the example embodiment, the internal electrodes may include first to fourth internal electrodes 121-124.

In this case, the first to third internal electrodes 121-123 as one internal electrode layer may be disposed on one first dielectric layer 111 and may be spaced apart from each other, and the fourth internal electrode 124 as another internal electrode layer may be disposed on the second dielectric layer 112 such that the first and second dielectric layers 111 and 112 may be alternately disposed in the Z direction. In one example, the first to third internal electrodes 121-123 as one internal electrode layer and the fourth internal electrode 124 as another internal electrode layer may be disposed on opposing surfaces of the first second dielectric layer 111 or opposing surfaces of the second dielectric layer 111.

In this case, the first internal electrode 121 may be configured as an electrode connected to aground (GND) terminal, and the second and third internal electrodes 122 and 123 may be configured as electrodes connected to a signal terminal.

The capacitor body 110 may include an active region contributing to the formation of capacitance of the capacitor, and upper and lower cover regions formed above and below the active region in the Z direction as upper and lower margin portions.

The upper and lower cover regions may have a material and a configuration the same as those of the first and second dielectric layers 111 and 112 other than the configuration in which the upper and lower cover regions do not include internal electrodes.

The upper and lower cover regions may be formed by laminating a single dielectric layer or two or more first or second dielectric layers 111 and 112 on upper and lower surfaces of the active region in the Z direction, respectively, and may prevent damages to the internal electrodes caused by physical or chemical stress.

The multilayer capacitor 100 in the example embodiment may include first to fourth external electrodes 131-134 formed on an external side of the capacitor body 110 and selectively and electrically connected to the internal electrodes.

The first and second external electrodes 131 and 132 may be disposed on the fifth and sixth surfaces 5 and 6 of the capacitor body 110, respectively.

The first and second lead portions of the first internal electrode 121 may be electrically connected to the first and second external electrodes 131 and 132.

In this case, the first and second external electrodes 131 and 132 may extend to portions of the first and second surfaces 1 and 2 of the capacitor body 110.

The third and fourth external electrodes 133 and 134 may be disposed on the third and fourth surfaces 3 and 4 of the capacitor body 110, respectively.

The second internal electrode 122 may be electrically connected to the third external electrode 133, and the third internal electrode 123 may be electrically connected to the fourth external electrode 134.

In this case, the third and fourth external electrodes 133 and 134 may extend to portions of the first and second surfaces 1 and 2 of the capacitor body 110.

The third and fourth external electrodes 133 and 134 may further extend to portions of the fifth and sixth surfaces 5 and 6 of the capacitor body 110 if desired.

The third and fourth external electrodes 143 and 144 may be spaced apart from the first and second external electrodes by a predetermined distance on the third and fourth surfaces 3 and 4 of the capacitor body 110 to not be in contact with the first and second external electrodes 131 and 132.

The first to fourth external electrodes 131 to 134 may be formed by a conductive paste including a conductive metal.

The conductive metal may be nickel (Ni), copper (Cu), tin (Sn), or alloys thereof, but an example of the conductive metal is not limited thereto.

A method of forming the first to fourth external electrodes 131-134 is not limited to any particular method, and the first to fourth external electrodes 131-134 may be formed by dipping the capacitor body 110 in a conductive paste, for example, and other methods such as sputtering or plating may be used.

Plating layers may be formed on surfaces of the first to fourth external electrodes 131-134, respectively.

The plating layer may include a nickel plating layer formed on each of the first to fourth external electrodes 131 to 134 and a tin plating layer formed on the nickel plating layer.

The first internal electrode 121 may be disposed on the first dielectric layer 111, may be exposed to the fifth and sixth surfaces 5 and 6 of the capacitor body 110, and may be connected to the first and second external electrodes 131 and 132.

In this case, the first internal electrode 121 may include a first body portion 121a and first and second lead portions 121b and 121c.

The first body portion 121a may overlap a portion of the fourth internal electrode 124 in the Z direction.

The first lead portion 121b may extend from the first body portion 121a to be exposed toward the fifth surface 5 of the capacitor body 110, and may be connected to the first external electrode 131.

The second lead portion 121c may extend from the first body portion 121a to be exposed toward the sixth surface 6 of the capacitor body 110 and may be connected to the second external electrode 132.

The second internal electrode 122 may be disposed on the first dielectric layer 111 and may be spaced apart from the first internal electrode 121, and may be exposed through the third surface 3 of the capacitor body 110 and may be connected to the third external electrode 133.

The third internal electrode 123 may be disposed on the first dielectric layer 111 and may be spaced apart from the first internal electrode 121, and may be exposed through the fourth surface 4 of the capacitor body 110 and may be connected to the fourth external electrode 134.

In this case, the third internal electrode 123 may form a symmetrical structure with the second internal electrode 122 with the first internal electrode 121 in the middle in the X direction.

The fourth internal electrode 124 may be disposed on the second dielectric layer 112 and may be spaced apart from the third to sixth surfaces 3-6 of the capacitor body 110, and may overlap a portion of the first to third internal electrodes 121-123 in the Z direction. Accordingly, the fourth internal electrode 124 may be configured as a floating electrode.

An intermediate portion of the fourth internal electrode 124 taken in the X direction may overlap the first body portion 121a of the first internal electrode 121 in the Z direction, and a left end portion taken in the X direction may overlap a portion of the second internal electrode 122 in the Z direction, and a right end portion in the X direction may overlap a portion of the third internal electrode 123 in the Z direction.

The first to fourth internal electrodes 121 to 124 may be formed by a conductive paste including a conductive metal.

The conductive metal is not limited to the above example, and may be formed using a noble metal material such as platinum (Pt), palladium (Pd), palladium-silver (Pd—Ag) alloy, and conductive paste including at least one of nickel (Ni) and copper (Cu).

In this case, as the method of printing the conductive paste, a screen printing method or a gravure printing method may be used, and an example embodiment thereof is not limited thereto.

Figure 4:
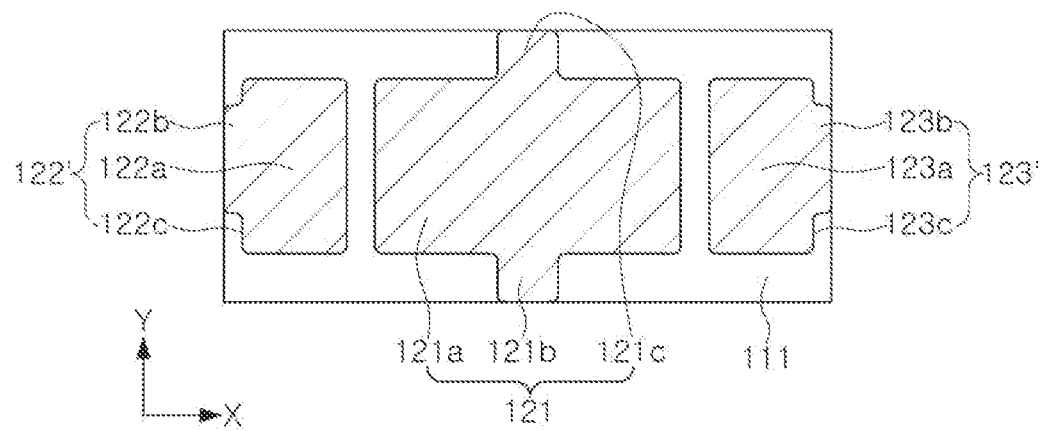
FIG. 4 is a plan diagram illustrating another example embodiment of second and third internal electrodes.

FIG. 4 is a plan diagram illustrating another example embodiment of second and third internal electrodes.

Referring to FIG. 4, the second internal electrode 122' may include at least one first cutout portion 122c in a portion exposed to the third surface 3 of the capacitor body 110.

In this case, the first cutout portion 122c may be formed at a corner of the portion of the second internal electrode 122' exposed to the third surface 3 of the capacitor body 110.

The first cutout portion 122c may be formed on each of both corners of the second internal electrode 122' in the Y direction, or may be formed on only one corner.

A portion of the second internal electrode 122' exposed to the third surface 3 of the capacitor body 110, especially a corner portion, may substantially protrude in the process of grinding the surface of the capacitor body 110 before the third external electrode 133 is formed.

In this case, after the third external electrode 133 is formed, the second internal electrode 122' may penetrate into the third external electrode 133, or the corner portion of the second internal electrode 122' may protrude out of the third external electrode 133.

The above issue may be prevented by forming the first cutout portion 122c in the second internal electrode 122' as in the example embodiment.

The shape of the first cutout portion 122c of the second internal electrode 122' is not limited to the example illustrated in FIG. 4 and may be varied.

The third internal electrode 123' may include at least one second cutout portion 123c in a portion exposed to the fourth surface 4 of the capacitor body 110.

In this case, the second cutout portion 123c may be formed at a corner of the portion exposed from the third internal electrode 123' to the fourth surface 4 of the capacitor body 110.

The second cutout portion 123c may be formed at each of both corners of the third internal electrode 123' in the Y direction, or may be formed on only one corner.

A portion of the third internal electrode 123' exposed to the fourth surface 4 of the capacitor body 110, especially a corner portion thereof may substantially protrude in the process of grinding the surface of the capacitor body 110 before the fourth external electrode 134 is formed.

In this case, after the fourth external electrode 134 is formed, the third internal electrode 123' may penetrate into the fourth external electrode 134, or the corner portion of the third internal electrode 123' may protrude out of the fourth external electrode 134.

The above issue may be prevented by forming the second cutout portion 123c in the third internal electrode 123' as in the example embodiment.

Also, the shape of the second cut-out portion 123c of the third internal electrode 123' is not limited to the example illustrated in FIG. 4 and may be varied.

In other words, the second internal electrode 122' may include a second body portion 122a overlapping a portion of the fourth internal electrode 124 in the Z direction, and a third lead portion 122b extending toward the third surface 3 of the capacitor body 110 and connected to the third external electrode 133.

In this case, the second internal electrode 122' may be divided into the second body portion 122a and the third lead portion 122b by the first cutout portion 122c.

Also, the third internal electrode 123' may include a third body portion 123a overlapping a portion of the fourth internal electrode 124 in the Z direction, and a fourth lead portion 123b extending toward the fourth surface 4 of the capacitor body 110 and connected to the fourth external electrode 134 in the third body portion 123a.

In this case, the third internal electrode 123' may be divided into the third body portion 123a and the fourth lead portion 123b by the second cutout portion 123c.

Figure 5:
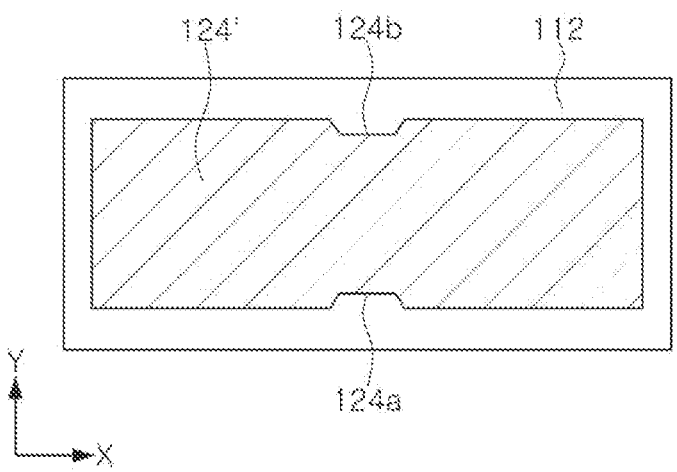
FIG. 5 is a plan diagram illustrating another example embodiment of a fourth internal electrode.

FIG. 5 is a plan diagram illustrating another example embodiment of a fourth internal electrode.

Referring to FIG. 5, the fourth internal electrode 124' may have first and second grooves 124a and 124b formed at both front ends in the Y direction, respectively.

In this case, the first and second groove portions 124a and 124b may be formed in positions overlapping the first and second lead portions 121b and 121c of the first internal electrode 121 in the Z direction, respectively.

The first groove portion 124a may further increase the distance between the front end of the fourth internal electrode 124' and the fifth surface 5 of the capacitor body 110, and the second groove portion 124c may further increase the distance between the front end of the fourth internal electrode 124' and the sixth surface 6 of the capacitor body 110.

In this case, since the positions in which the first and second groove portions 124b and 224c are formed may correspond to the positions in which the first and second external electrodes 131 and 132 are formed, the phenomenon in which the fourth internal electrode 124' is in contact with the first and second lead portions 121b and 121c of the first internal electrode 121 and also the first and second external electrodes 131 and 132 may be prevented such that shorts may be prevented, thereby improving reliability of the multilayer capacitor 100.

Also, the shapes of the first and second grooves 124a and 124b of the fourth internal electrode 124' are not limited to the examples illustrated in FIG. 5 and may be varied.

Figure 6:
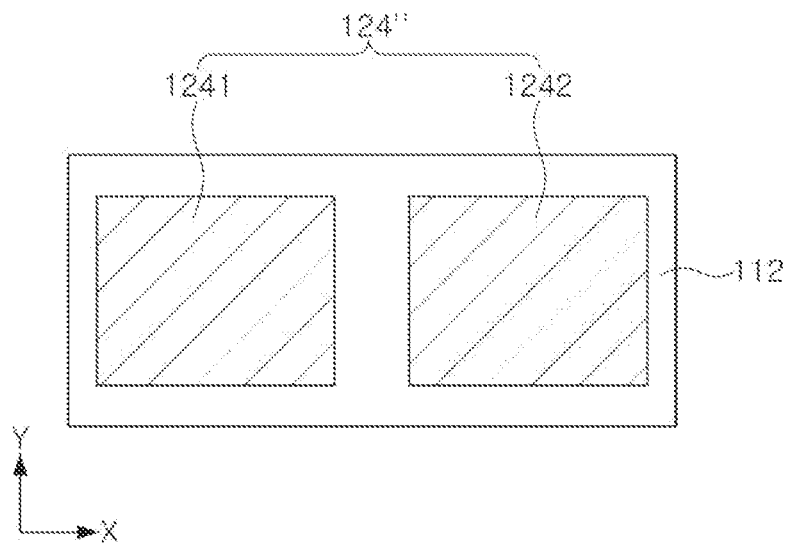
FIG. 6 is a plan diagram illustrating another example embodiment of a fourth internal electrode.

FIG. 6 is a plan diagram illustrating another example embodiment of a fourth internal electrode.

Referring to FIG. 6, the fourth internal electrode 124" may include a 4-1 internal electrode 1241 and a 4-2 internal electrode 1242 disposed on one second dielectric layer 112 and may be spaced apart from each other in the X direction.

The 4-1 internal electrode 1241 may overlap portions of the first and second internal electrodes 121 and 122, and the 4-2 internal electrode 1242 overlap portions of the first and third internal electrodes 121 and 123.

A space portion in which the 4-1 internal electrode 1241 and the 4-2 internal electrode 1242 are spaced apart from each other in the X direction may correspond to a position in which the first and second external electrodes 131 and 132 are formed, and accordingly, in the process of manufacturing the capacitor, the phenomenon in which the fourth internal electrode 124" is in contact with the first and second lead portions 121b and 121c of the first internal electrode 121 and also the first and second external electrodes 131 and 132 may be prevented such that shorts may be prevented, thereby improving reliability of the multilayer capacitor 100.

To improve withstand voltage properties in a multilayer capacitor, a multilayer capacitor may have a structure in which the first internal electrode is used as a floating electrode, the second internal electrode is configured as two electrodes disposed on one dielectric layer and exposed to the third and fourth surfaces of the capacitor body, respectively, the first and second internal electrodes are alternately laminated, and a pair of external electrodes are disposed on both end surfaces of the capacitor body.

Figure 7:
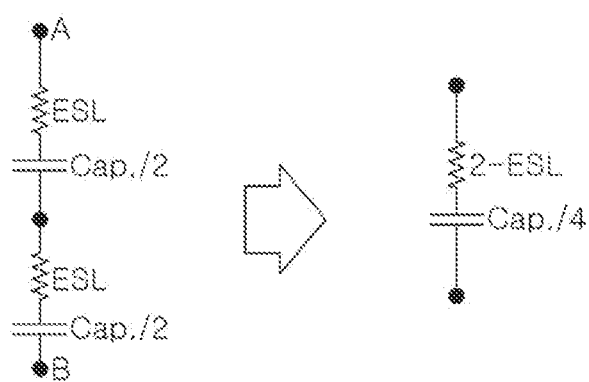
FIG. 7 is an equivalent circuit diagram illustrating a general two-cap type multilayer capacitor having a floating electrode structure.

In the case of a general two-cap type multilayer capacitor designed such that the internal electrode has a floating electrode structure, as illustrated in FIG. 7, the two capacitors are configured in series in terms of an equivalent circuit, such that the withstand voltage properties may increase twice as compared to a multilayer capacitor including a general internal electrode, rather than a floating electrode.

However, in this case, since capacity of the multilayer capacitor may greatly be reduced to ¼, and the ESL may increase twice, it may be difficult to apply the multilayer capacitor to a product having high power or high frequency properties.

In the example embodiment, a structure of the floating electrode may be applied to the fourth internal electrode formed on the second dielectric layer, the first and second external electrodes, signal terminals, and the third and fourth external electrodes, ground terminals may be included, the first and second external electrodes may be connected to the first internal electrode formed on the first dielectric layer, and the third and fourth external electrodes may be configured to be connected to the second and third internal electrodes spaced apart from the first internal electrode on the first dielectric layer.

Figure 8:
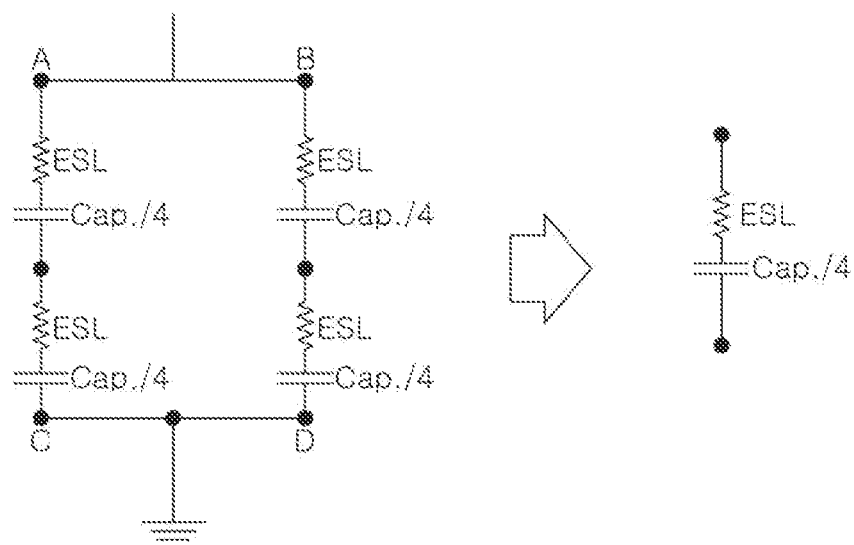
FIG. 8 is an equivalent circuit diagram illustrating a multilayer capacitor according to an example embodiment of the present disclosure.

Therefore, as illustrated in FIG. 8, while the withstand voltage properties of the multilayer capacitor may improve in terms of an equivalent circuit, and ESL may be reduced to ½ as compared to the multilayer capacitor illustrated in FIG. 7.

Accordingly, the multilayer capacitor may be applied to a product having high power or high frequency properties.

Figure 9:
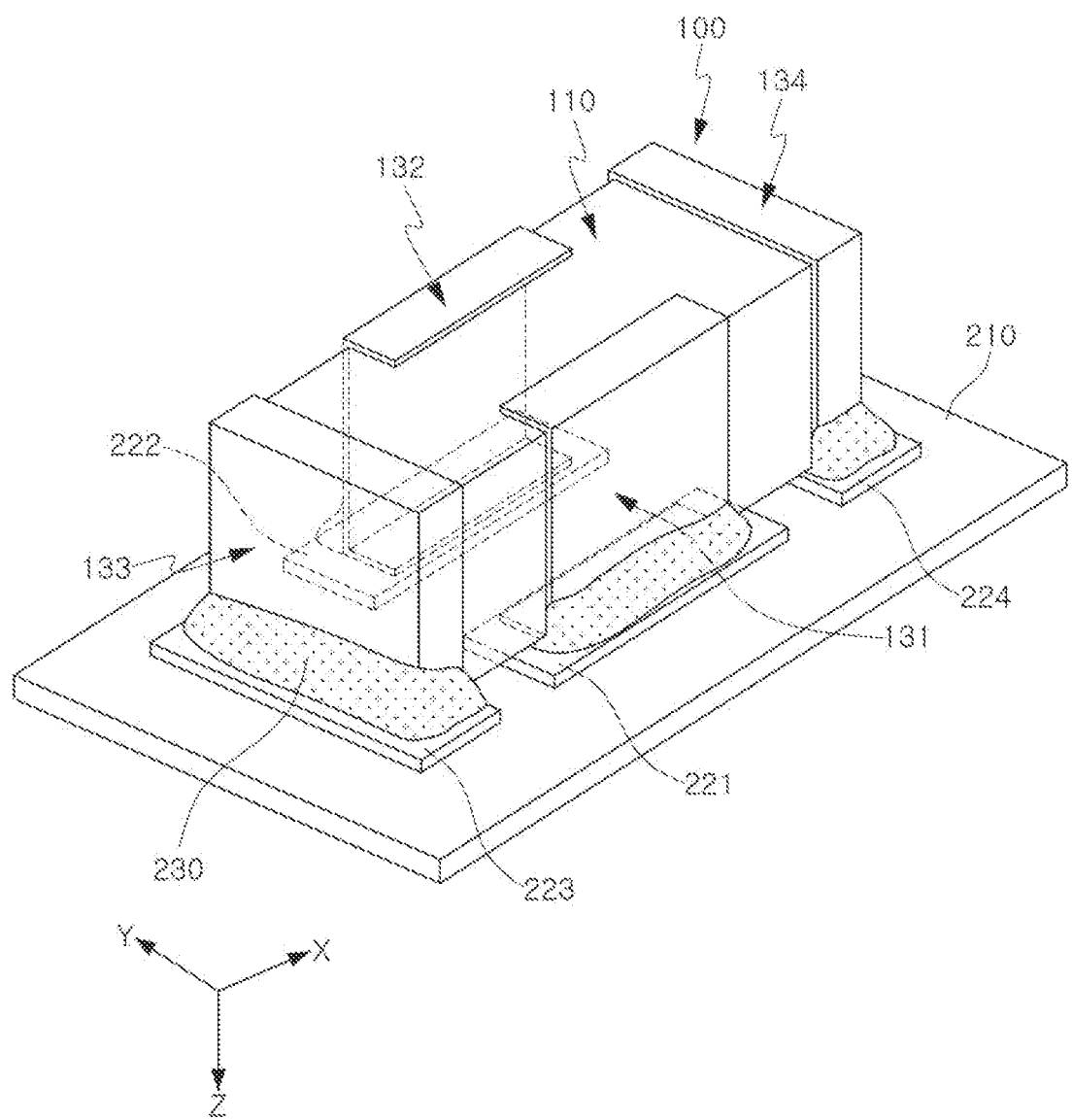
FIG. 9 is a perspective diagram illustrating a board on which the multilayer capacitor illustrated in FIG. 1 is mounted.

FIG. 9 is a perspective diagram illustrating a board on which the multilayer capacitor illustrated in FIG. 1 is mounted.

Referring to FIG. 9, a board including a multilayer capacitor mounted thereon in the example embodiment may include a board 210 having first to fourth electrode pads 221-224 disposed on one surface and spaced apart from each other, and a multilayer capacitor 100 mounted such that the first to fourth external electrodes 131-134 may be connected to corresponding first to fourth electrode pads 221-224, respectively, on one surface of the board 210.

In FIG. 9, reference numeral 230 denotes solder for bonding the electrode pad and the external electrode.

According to the aforementioned example embodiment, the multilayer capacitor may have a high withstand voltage and may implement low ESL properties.

One element described in a particular example embodiment, even if it is not described in another example embodiment, may be understood as a description related to another example embodiment, unless an opposite or contradictory description is provided therein. For example, a laminate structure may include an internal electrode structure shown in one of FIGS. 2A and 4 and another internal electrode structure shown in one of FIGS. 2B, 5, and 6.

While the example embodiments have been illustrated and described above, it will be apparent to those skilled in the art that modifications and variations could be made without departing from the scope of the present invention as defined by the appended claims.

What is claimed is:

1. A multilayer capacitor, comprising:
  a capacitor body including first and second dielectric layers and internal electrodes alternately laminated, and including first and second surfaces opposing each other, third and fourth surfaces opposing each other in a length direction and connected to the first and second surfaces, and fifth and sixth surfaces opposing each other and connected to the first and second surfaces and the third and fourth surfaces;
  first and second external electrodes disposed on the fifth and sixth surfaces of the capacitor body, respectively; and
  third and fourth external electrodes disposed on the third and fourth surfaces of the capacitor body, respectively,
  wherein the internal electrodes include:
  a first internal electrode disposed on the first dielectric layer and connected to the first and second external electrodes;
  a second internal electrode disposed on the first dielectric layer, spaced apart from the first internal electrode, and connected to the third external electrode;
  a third internal electrode disposed on the first dielectric layer, spaced apart from the first internal electrode, and connected to the fourth external electrode; and
  a fourth internal electrode disposed on the second dielectric layer, spaced apart from the first to fourth external electrodes, and overlapping at least a portion of the first to third internal electrodes,
  wherein the second internal electrode has at least one first cutout portion at a front end, adjacent to the third surface of the capacitor body in a direction perpendicular to the third surface of the capacitor body,
  wherein the third internal electrode has at least one second cutout portion at a front end, adjacent to the fourth surface of the capacitor body in a direction perpendicular to the fourth surface of the capacitor body,
  wherein each of the second and third internal electrodes has a length which is less than ½ a length of the capacitor body in the length direction,
  wherein a length between the third and fourth surfaces of the capacitor body is greater than a length between the fifth and sixth surfaces, and
  wherein the fourth internal electrode includes first and second grooves in respective central portions of front ends in a direction perpendicular to the fifth and sixth surfaces of the capacitor body, respectively.

2. The multilayer capacitor of claim 1, wherein the first internal electrode includes:
  a first body portion overlapping a portion of the fourth internal electrode; and
  first and second lead portions extending from the first body portion toward the fifth and sixth surfaces of the capacitor body, respectively.

3. The multilayer capacitor of claim 1,
  wherein the first cutout portion is on at least one corner, and
  wherein the second cutout portion is on at least one corner.

4. The multilayer capacitor of claim 1,
  wherein the second internal electrode includes a second body portion overlapping a portion of the fourth internal electrode, and a third lead portion extending from the second body portion toward the third surface of the capacitor body, and
  wherein the third internal electrode includes a third body portion overlapping a portion of the fourth internal electrode, and a fourth lead portion extending from the third body portion toward the fourth surface of the capacitor body.

5. The multilayer capacitor of claim 1,
  wherein the first and second external electrodes extend from the fifth and sixth surfaces of the capacitor body to portions of the first and second surfaces, respectively, and wherein the third and fourth external electrodes extend from the third and fourth surfaces of the capacitor body to portions of the first and second surfaces, respectively.

6. The multilayer capacitor of claim 1, wherein the first to fourth external electrodes further include a plating layer disposed on respective surfaces thereof.

7. The multilayer capacitor of claim 1,
wherein the first internal electrode includes a first body portion overlapping a portion of the fourth internal electrode, and first and second lead portions extending from the first body portion toward the fifth and sixth surfaces of the capacitor body, respectively,
wherein the second internal electrode includes a second body portion overlapping a portion of the fourth internal electrode, and a third lead portion extending from the second body portion toward the third surface of the capacitor body, and
wherein the third internal electrode includes a third body portion overlapping a portion of the fourth internal electrode, and a fourth lead portion extending from the third body portion toward the fourth surface of the capacitor body.

8. The multilayer capacitor of claim 1,
wherein the first internal electrode includes a first body portion overlapping a portion of the fourth internal electrode, and first and second lead portions extending from the first body portion toward the fifth and sixth surfaces of the capacitor body, respectively,
wherein the second internal electrode includes a second body portion overlapping a portion of the fourth internal electrode, and a third lead portion extending from the second body portion toward the third surface of the capacitor body, and
wherein the third internal electrode includes a third body portion overlapping a portion of the fourth internal electrode, and a fourth lead portion extending from the third body portion toward the fourth surface of the capacitor body.

9. The multilayer capacitor of claim 1,
wherein the first internal electrode includes a first body portion overlapping a portion of the fourth internal electrode, and first and second lead portions extending from the first body portion toward the fifth and sixth surfaces of the capacitor body, respectively,
wherein the second internal electrode includes a second body portion overlapping a portion of the fourth internal electrode, and a third lead portion extending from the second body portion toward the third surface of the capacitor body, and
wherein the third internal electrode includes a third body portion overlapping a portion of the fourth internal electrode, and a fourth lead portion extending from the third body portion toward the fourth surface of the capacitor body.

10. The multilayer capacitor of claim 1,
wherein the first internal electrode includes a first body portion overlapping a portion of the fourth internal electrode, and first and second lead portions extending from the first body portion toward the fifth and sixth surfaces of the capacitor body, respectively,
wherein the second internal electrode includes a second body portion overlapping a portion of the fourth internal electrode, and a third lead portion extending from the second body portion toward the third surface of the capacitor body,
wherein the third internal electrode includes a third body portion overlapping a portion of the fourth internal electrode, and a fourth lead portion extending from the third body portion toward the fourth surface of the capacitor body, and
wherein the fourth internal electrode has both front ends in a direction perpendicular to the fifth and sixth surfaces of the capacitor body and configured to be flat.

11. The multilayer capacitor of claim 1,
wherein the first internal electrode includes a first body portion overlapping a portion of the fourth internal electrode and first and second lead portions extending from the first body portion toward the fifth and sixth surfaces of the capacitor body, respectively,
wherein the second internal electrode includes a second body portion overlapping a portion of the fourth internal electrode, and a third lead portion extending from the second body portion toward the third surface of the capacitor body, and
wherein the third internal electrode includes a third body portion overlapping a portion of the fourth internal electrode, and a fourth lead portion extending from the third body portion toward the fourth surface of the capacitor body.

12. The multilayer capacitor of claim 1,
wherein the first internal electrode includes a first body portion overlapping a portion of the fourth internal electrode, and first and second lead portions extending from the first body portion toward the fifth and sixth surfaces of the capacitor body, respectively,
wherein the second internal electrode includes a second body portion overlapping a portion of the fourth internal electrode, and a third lead portion extending from the second body portion toward the third surface of the capacitor body, and
wherein the third internal electrode includes a third body portion overlapping a portion of the fourth internal electrode, and a fourth lead portion extending from the third body portion toward the fourth surface of the capacitor body.

13. The multilayer capacitor of claim 1,
wherein the first internal electrode includes a first body portion overlapping a portion of the fourth internal electrode, and first and second lead portions extending from the first body portion toward the fifth and sixth surfaces of the capacitor body, respectively,
wherein the second internal electrode includes a second body portion overlapping a portion of the fourth internal electrode, and a third lead portion extending from the second body portion toward the third surface of the capacitor body, and
wherein the third internal electrode includes a third body portion overlapping a portion of the fourth internal electrode, and a fourth lead portion extending from the third body portion toward the fourth surface of the capacitor body.

14. The multilayer capacitor of claim 1,
wherein the first internal electrode includes a first body portion overlapping a portion of the fourth internal electrode, and first and second lead portions extending from the first body portion toward the fifth and sixth surfaces of the capacitor body, respectively,
wherein the second internal electrode includes a second body portion overlapping a portion of the fourth internal electrode, and a third lead portion extending from the second body portion toward the third surface of the capacitor body, wherein the third internal electrode includes a third body portion overlapping a portion of the fourth internal electrode, and a fourth lead portion extending from the third body portion toward the fourth surface of the capacitor body, and wherein the fourth internal electrode has both front ends in a direction perpendicular to the fifth and sixth surfaces of the capacitor body and configured to be flat.

15. A board including a multilayer capacitor mounted thereon, the board comprising:
a board having first to fourth electrode pads on an upper surface thereof; and
the multilayer capacitor of claim 1, mounted on the board such that the first to fourth external electrodes are connected to the first to fourth electrode pads, respectively.

16. A multilayer capacitor, comprising:
a capacitor body including a dielectric layer and first and second internal electrode layers respectively disposed on opposing surfaces of the dielectric layer; and
first to third external electrodes disposed on the capacitor body and spaced apart from each other,
wherein the first internal electrode layer includes first to third internal electrodes respectively connected to the first to third external electrodes,
the second internal electrode layer is spaced apart from an outer surface of the capacitor body, and overlaps with each of the first to third internal electrodes in a stacking direction of the first and second internal electrode layers, wherein the second internal electrode includes:
a second body portion overlapping a portion of the second electrode layer; and
a second lead portion extending from the second body portion in a length direction of the capacitor body and connecting the second body portion to the second external electrode,
wherein the third internal electrode includes:
a third body portion overlapping a portion of the second electrode layer; and
a third lead portion extending from the third body portion in the length direction of the capacitor body and connecting the third body portion to the third external electrode,
wherein each of the second and third internal electrodes has a length which is less than ½ a length of the capacitor body in the length direction of the capacitor body, and
wherein the second internal electrode layer includes a groove overlapping a lead portion of the first internal electrode in the stacking direction of the first and second internal electrode layers.

17. The multilayer capacitor of claim 16, wherein the first internal electrode includes:
a first body portion overlapping a portion of the second electrode layer; and
a first lead portion extending from the first body portion and connecting the first body portion to the first external electrode.

\* \* \* \* \*